(12) United States Patent
Xu et al.

(10) Patent No.: US 11,139,357 B2
(45) Date of Patent: Oct. 5, 2021

(54) ORGANIC LIGHT-EMITTING DIODE DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Pan Xu, Beijing (CN); Yicheng Lin, Beijing (CN); Cuili Gai, Beijing (CN); Ling Wang, Beijing (CN); Yongqian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 10 days.

(21) Appl. No.: 16/499,809

(22) PCT Filed: Apr. 1, 2019

(86) PCT No.: PCT/CN2019/080770
§ 371 (c)(1),
(2) Date: Sep. 30, 2019

(87) PCT Pub. No.: WO2019/210757
PCT Pub. Date: Nov. 7, 2019

(65) Prior Publication Data
US 2020/0273933 A1   Aug. 27, 2020

(30) Foreign Application Priority Data
May 4, 2018 (CN) .......... 201810419696.X

(51) Int. Cl.
*H01L 27/32* (2006.01)
*H01L 51/56* (2006.01)
(Continued)

(52) U.S. Cl.
CPC ...... *H01L 27/3269* (2013.01); *H01L 27/3262* (2013.01); *H01L 27/3272* (2013.01);
(Continued)

(58) Field of Classification Search
CPC combination set(s) only.
See application file for complete search history.

(56) References Cited

U.S. PATENT DOCUMENTS

2007/0241998 A1   10/2007   Fish et al.
2007/0257250 A1   11/2007   Tseng et al.
(Continued)

FOREIGN PATENT DOCUMENTS

CN    1934605 A      3/2007
CN    101068026 A    11/2007
(Continued)

*Primary Examiner* — Moin M Rahman
(74) *Attorney, Agent, or Firm* — Muncy, Geissler, Olds and Lowe, P.C.

(57) ABSTRACT

An OLED display substrate, a manufacturing method thereof, and a display device are provided. The manufacturing method includes forming a PIN photodiode on a base substrate, forming an insulative protection layer covering the PIN photodiode, and forming an oxide TFT. The PIN photodiode is formed prior to the formation of an active layer of the oxide TFT, and the insulative protection layer covering the PIN photodiode is formed prior to the formation of a source electrode and a drain electrode of the oxide TFT.

4 Claims, 6 Drawing Sheets

(51) Int. Cl.
  *H01L 27/12*  (2006.01)
  *H01L 29/786*  (2006.01)

(52) U.S. Cl.
  CPC .......... *H01L 51/56* (2013.01); *H01L 27/1225* (2013.01); *H01L 29/7869* (2013.01); *H01L 29/78633* (2013.01); *H01L 2227/323* (2013.01)

(56) References Cited

U.S. PATENT DOCUMENTS

| | | | |
|---|---|---|---|
| 2014/0231804 A1* | 8/2014 | Yan | H01L 27/14616 257/53 |
| 2015/0123119 A1 | 5/2015 | Sekine et al. | |
| 2016/0013243 A1 | 1/2016 | O'Rourke et al. | |
| 2016/0049431 A1* | 2/2016 | Taghibakhsh | H01L 27/14638 250/370.08 |
| 2016/0293659 A1* | 10/2016 | Sekine | H01L 27/14692 |
| 2017/0236857 A1* | 8/2017 | Bu | H01L 27/14689 438/80 |
| 2019/0019813 A1 | 1/2019 | Ren et al. | |
| 2020/0058680 A1 | 2/2020 | Liu | |

FOREIGN PATENT DOCUMENTS

| | | |
|---|---|---|
| CN | 203456513 U | 2/2014 |
| CN | 104637962 A | 5/2015 |
| CN | 106098713 A | 11/2016 |
| CN | 107359168 A | 11/2017 |
| CN | 108336100 A | 7/2018 |
| CN | 108615826 A | 10/2018 |
| EP | 1 351 310 A2 | 10/2003 |
| KR | 10-2016-0054102 A | 5/2016 |

\* cited by examiner

ORGANIC LIGHT-EMITTING DIODE DISPLAY SUBSTRATE, MANUFACTURING METHOD THEREOF, AND DISPLAY DEVICE

CROSS-REFERENCE TO RELATED APPLICATION

The present application is the U.S. national phase of PCT Application No. PCT/CN2019/080770 filed on Apr. 1, 2019, which claims a priority of the Chinese patent application No. 201810419696.X filed on May 4, 2018, which is incorporated herein by reference in its entirety.

TECHNICAL FIELD

The present disclosure relates to the field of display technology, in particular to an organic light-emitting diode (OLED) display substrate, a manufacturing method thereof, and a display device.

BACKGROUND

OLED products have attracted more and more attentions in the market. Each OLED product mainly includes two parts, i.e., thin film transistors (TFTs) and OLEDs. With the elapse of time, the TFTs and OLEDs may be degraded, resulting in deterioration in display brightness and uniformity.

SUMMARY

In one aspect, the present disclosure provides in some embodiments a method of manufacturing an OLED display substrate, including forming a PIN photodiode on a base substrate, forming an insulative protection layer covering the PIN photodiode, and forming an oxide TFT. The PIN photodiode is formed prior to the formation of an active layer of the oxide TFT, and the insulative protection layer covering the PIN photodiode is formed prior to the formation of a source electrode and a drain electrode of the oxide TFT.

In a possible embodiment of the present disclosure, the forming the PIN photodiode on the base substrate includes: forming a first electrode of the PIN photodiode on the base substrate; forming a photovoltaic conversion layer of the PIN photodiode on the first electrode; and forming a second electrode of the PIN photodiode on the photovoltaic conversion layer.

In a possible embodiment of the present disclosure, the oxide TFT is a top-gate TFT. Prior to forming the active layer of the oxide TFT, the method further includes forming a light-shielding layer. An orthogonal projection of the active layer onto the base substrate falls within an orthogonal projection of the light-shielding layer onto the base substrate, and the light-shielding layer and the first electrode are formed through a single patterning process.

In a possible embodiment of the present disclosure, the oxide TFT is a bottom-gate TFT. Prior to forming the active layer of the oxide TFT, the method further includes forming a gate electrode of the oxide TFT. An orthogonal projection of the active layer onto the base substrate falls within an orthogonal projection of the gate electrode onto the base substrate, and the gate electrode and the first electrode are formed through a single patterning process.

In a possible embodiment of the present disclosure, the insulative protection layer is a gate insulation layer of the oxide TFT.

In a possible embodiment of the present disclosure, the oxide TFT includes a switching TFT connected to the PIN photodiode. Prior to forming the source electrode and the drain electrode of the oxide TFT, the method further includes forming a via-hole penetrating through a layer on the second electrode of the PIN photodiode. Subsequent to forming the via-hole penetrating through the layer on the second electrode of the PIN photodiode, the method further includes forming a conductive connection pattern. The conductive connection pattern is at least partially located within the via-hole and configured to connect the second electrode and a source electrode of the switching TFT. The conductive connection pattern and the source electrode and the drain electrode of the oxide TFT are formed through a single patterning process.

In another aspect, the present disclosure provides in some embodiments an OLED display substrate, including a base substrate, a PIN photodiode arranged on the base substrate, an insulative protection layer covering the PIN photodiode, and an oxide TFT including an active layer. The active layer is arranged on the insulative protection layer.

In a possible embodiment of the present disclosure, the PIN photodiode includes a first electrode, a photovoltaic conversion layer arranged on the first electrode, and a second electrode arranged on the photovoltaic conversion layer.

In a possible embodiment of the present disclosure, the oxide TFT is a top-gate TFT. The OLED display substrate further includes a light-shielding layer. An orthogonal projection of the active layer of the oxide TFT onto the base substrate falls within an orthogonal projection of the light-shielding layer onto the base substrate, and the light-shielding layer is arranged at a same layer, and made of a same material, as the first electrode.

In a possible embodiment of the present disclosure, the insulative protection layer covers the light-shielding layer, and a gate electrode is arranged on the active layer.

In a possible embodiment of the present disclosure, the light-shielding layer and the first electrode are directly arranged at a same layer on the base substrate, and a part of the insulative protection layer extends into between the light-shielding layer and the first electrode and is in direct contact with the base substrate.

In a possible embodiment of the present disclosure, the oxide TFT is a bottom-gate TFT. An orthogonal projection of the active layer of the oxide TFT onto the base substrate falls within an orthogonal projection of the gate electrode of the oxide TFT onto the base substrate, and the gate electrode of the oxide TFT is arranged at a same layer, and made of a same material, as the first electrode.

In a possible embodiment of the present disclosure, the insulative protection layer covers the gate electrode.

In a possible embodiment of the present disclosure, the gate electrode and the first electrode are directly arranged at a same layer on the base substrate, and a part of the insulative protection layer extends into between the gate electrode and the first electrode and is in direct contact with the base substrate.

In a possible embodiment of the present disclosure, the oxide TFT is a switching TFT connected to the PIN photodiode. The OLED display substrate further includes a conductive connection pattern connected to a source electrode of the switching TFT through a via-hole penetrating a layer on the second electrode. The conductive connection pattern is arranged at a same layer, and made of a same material, as a source electrode and a drain electrode of the oxide TFT.

In yet another aspect, the present disclosure provides in some embodiments an OLED display device including the above-mentioned OLED display substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
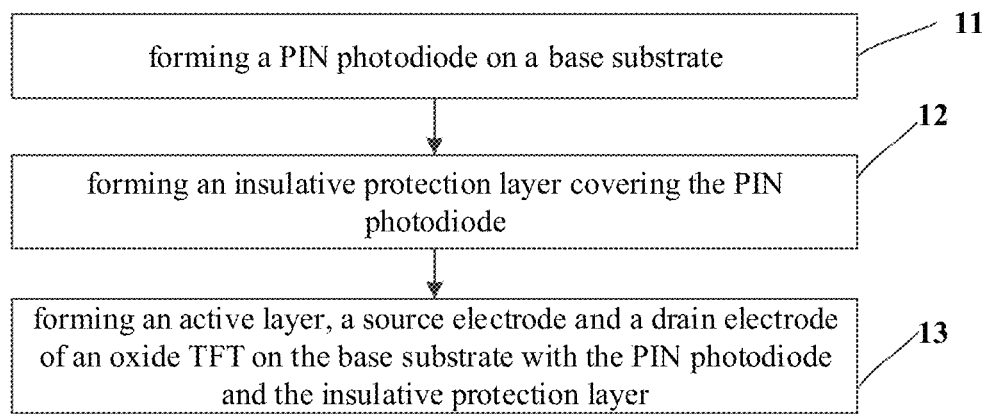
FIG. 1 is a flow chart of a method of manufacturing an OLED display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In use, each of TFTs and OLEDs may be degraded gradually, resulting in the deterioration in the display brightness and uniformity. Usually, the display brightness and uniformity are adjusted in a real-time electrical compensation mode. However, through the real-time electrical compensation, it is merely able to compensate for the degradation of the TFTs. It is difficult to perform the real-time electrical compensation for the OLEDs due to electrical intrinsic features thereof.

The brightness of the OLED is directly associated with a degradation level of the OLED, so the degradation level of the OLED may be determined in accordance with the brightness of the OLED. Currently, in some schemes, a PIN photodiode is applied to an OLED display substrate, so as to collect the brightness of the OLED, convert the brightness into an electric signal, and then transmit the electric signal to a driving Integrated Circuit (IC). Next, the driving IC changes a driving voltage for the OLED in accordance with the received electric signal, so as to perform real-time optical compensation.

An oxide TFT is configured to drive the OLED. The PIN photodiode may be applied to the OLED display substrate including both the oxide TFT and the OLED. During the manufacturing of the OLED display substrate, an active layer of the oxide TFT may be adversely affected by hydrogen atoms (H) generated during the formation of the PIN photodiode. In addition, the PIN photodiode may also be adversely affected by a metal wet-etching process for the formation of the oxide TFT. Hence, there is an urgent need to optimize the process of manufacturing the OLED display substrate including the oxide TFT, the OLED and the photodiode, so as to ensure the quality of the OLED display substrate.

The present disclosure provides in some embodiments a method of manufacturing an OLED display substrate, which includes forming a PIN photodiode on a base substrate, forming an insulative protection layer covering the PIN photodiode, and forming an oxide TFT. The PIN photodiode is formed prior to the formation of an active layer of the oxide TFT, and the insulative protection layer covering the PIN photodiode is formed prior to the formation of a source electrode and a drain electrode of the oxide TFT.

According to the embodiments of the present disclosure, the PIN photodiode may be formed prior to the formation of the active layer of the oxide TFT, so the active layer of the oxide TFT may not be adversely affected by the formation of the PIN photodiode. In addition, the insulative protection layer covering the PIN photodiode may be formed prior to the formation of the source electrode and the drain electrode of the oxide TFT, so the PIN photodiode may not be adversely affected by a wet-etching process for the source electrode and the drain electrode. As a result, it is able to optimize the manufacture of the OLED display substrate including the oxide TFT, the OLED and the PIN photodiode, thereby to improve the quality of the OLED display substrate.

As shown in FIG. 1, in a possible embodiment of the present disclosure, the method may include: Step 11 of forming the PIN photodiode on the base substrate; Step 12 of forming the insulative protection layer covering the PIN photodiode; and Step 13 of forming the active layer, the source electrode and the drain electrode of the oxide TFT on the base substrate provided with the PIN photodiode and the insulative protection layer.

According to the embodiments of the present disclosure, the PIN photodiode may be formed at first, then the insulative protection layer covering the PIN photodiode may be formed, and then the active layer, the source electrode and the drain electrode of the oxide TFT may be formed. The PIN photodiode may be formed prior to the active layer, so it is able to prevent the active layer of the oxide TFT from being adversely affected by the formation of the PIN photodiode. In addition, the insulative protection layer covering the PIN photodiode may be formed prior to the source electrode and the drain electrode, so it is able to prevent the PIN photodiode from being adversely affected by a wet-etching process for the source electrode and the drain electrode.

Figure 2:
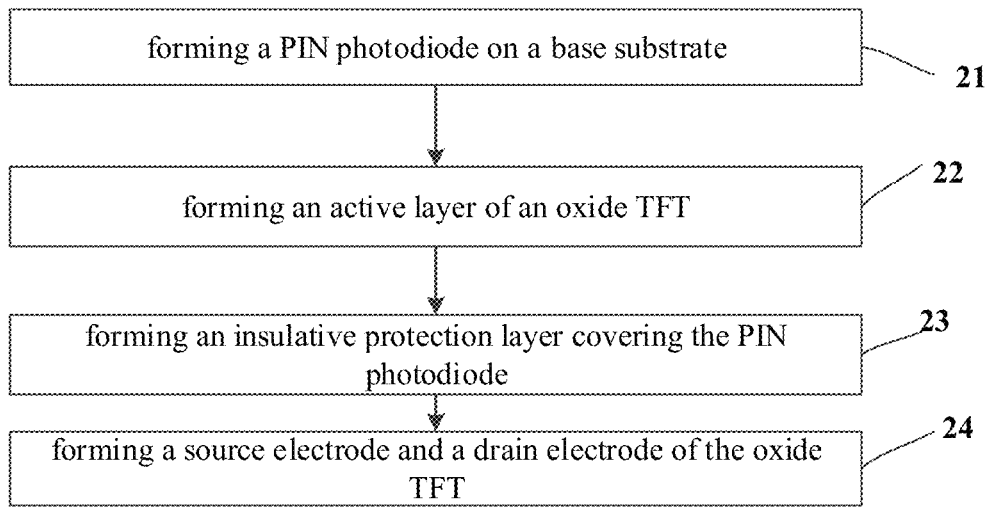
FIG. 2 is another flow chart of the method of manufacturing the OLED display substrate according to one embodiment of the present disclosure.

As shown in FIG. 2, in a possible embodiment of the present disclosure, the method may include: Step 21 of forming the PIN photodiode on the base substrate; Step 22 of forming the active layer of the oxide TFT; Step 23 of forming the insulative protection layer covering the PIN photodiode; and Step 24 of forming the source electrode and the drain electrode of the oxide TFT.

The method in FIG. 2 differs from that in FIG. 1 merely in that the active layer is formed prior to the insulative protection layer.

The OLED display substrate acquired in the embodiments of the present disclosure may include a plurality of subpixel regions, and one OLED may be arranged at each subpixel region. In a possible embodiment of the present disclosure, one PIN photodiode may also be arranged at each subpixel region. The PIN photodiode is configured to collect a light beam emitted by the OLED at the corresponding subpixel region, convert the collected light beam into an electric signal, and transmit the collected electric signal to a driving IC connected to the PIN photodiode. Upon the receipt of the electric signal, the driving IC may adjust a driving current applied to the OLED, so as to perform real-time optical compensation on the OLED.

In a possible embodiment of the present disclosure, the OLED may include an anode, a light-emitting layer and a cathode.

In a possible embodiment of the present disclosure, the oxide TFT may at least include a driving TFT for driving the OLED. For the driving TFT, a generated current may be affected remarkably due to any tiny change in its characteristic. In other words, the requirement on the characteristic of the driving TFT may be far higher than that on the characteristic of any other TFT. When the PIN photodiode needs to be formed on an OLED display panel, the driving TFT may be obviously adversely affected by the formation of the PIN photodiode. In order to prevent the driving TFT from being adversely affected by the formation of the PIN photodiode, in a possible embodiment of the present disclosure, the PIN photodiode may be formed prior to an active layer of the driving TFT.

In a possible embodiment of the present disclosure, the oxide TFT may further include a switching TFT. The PIN photodiode may be formed prior to the active layer of each oxide TFT (the driving TFT or the switching TFT), so as to prevent the characteristic of each oxide TFT from being adversely affected by the formation of the PIN photodiode.

Figure 3:
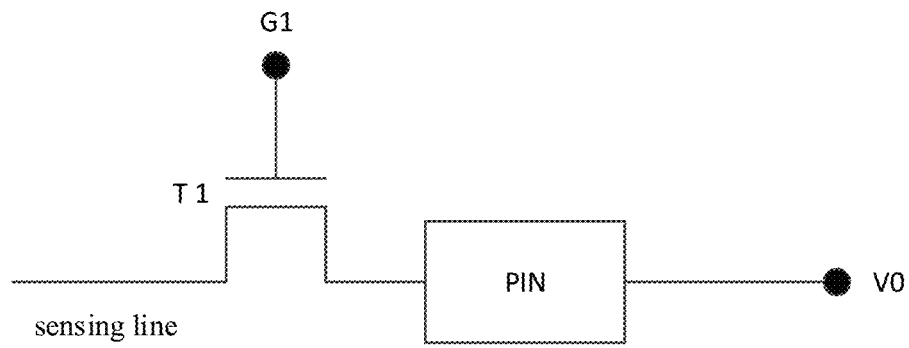
FIG. 3 is a schematic view showing an equivalent connection circuit for a PIN photodiode and a switching TFT according to one embodiment of the present disclosure.

In a possible embodiment of the present disclosure, the switching TFTs may include a switching TFT connected to the PIN photodiode and configured to control the PIN photodiode to be electrically connected to, or electrically disconnected from, the external driving IC. A gate electrode of the switching TFT may receive a control signal, and the control signal is used to turn on or off the switching TFT. A source electrode of the switching TFT may be connected to the PIN photodiode, and a drain electrode of the switching TFT may be connected to a sensing line, so as to connect the PIN photodiode to the external driving IC. The PIN photodiode may be controlled to be in operation or not i.e., whether to perform the optical compensation on the OLED is controlled according to the practical need. FIG. 3 shows an equivalent connection circuit of the PIN photodiode and the switching TFT. As shown in FIG. 3, PIN represents the PIN photodiode, T1 represents the switching TFT connected to the PIN photodiode, G1 represents the control signal applied to the gate electrode of T1 for turning on or off T1, and VO represents an operating voltage of the PIN photodiode. The source electrode of T1 may be connected to the PIN photodiode, and the drain electrode may be connected to the external driving IC via the sensing line, so the PIN photodiode may be connected to the external driving IC.

In the embodiments of the present disclosure, the PIN photodiode may be a PIN photodiode known in the art. The PIN photodiode may include a first electrode, a photovoltaic conversion layer arranged on the first electrode, and a second electrode arranged on the photovoltaic conversion layer. The photovoltaic conversion layer may include a P-type semiconductor, an I-type semiconductor, and an N-type semiconductor.

At this time, the forming the PIN photodiode on the base substrate may include: Step 31 of forming the first electrode of the PIN photodiode on the base substrate; Step 32 of forming the photovoltaic conversion layer of the PIN photodiode on the first electrode; and Step 33 of forming the second electrode of the PIN photodiode on the photovoltaic conversion layer.

In a possible embodiment of the present disclosure, the oxide TFT may be a top-gate TFT. Prior to forming the active layer of the oxide TFT, the method may further include forming a light-shielding layer. An orthogonal projection of the active layer onto the base substrate may fall within an orthogonal projection of the light-shielding layer onto the base substrate, and the light-shielding layer and the first electrode may be formed through a single patterning process.

In the embodiments of the present disclosure, through the formation of the light-shielding layer, it is able to prevent the active layer of the oxide TFT from being adversely affected by light, thereby to improve the stability of the oxide TFT. In addition, when the light-shielding layer and the first electrode of the PIN photodiode are formed through a single patterning process, it is able to reduce the quantity of masks for the manufacture of the OLED display substrate, thereby to reduce the manufacture cost.

In the embodiments of the present disclosure, the light-shielding layer and the first electrode may each be made of a metal material.

In a possible embodiment of the present disclosure, the oxide TFT may be a bottom-gate TFT. Prior to forming the active layer of the oxide TFT, the method may further include forming a gate electrode of the oxide TFT. An orthogonal projection of the active layer onto the base substrate may fall within an orthogonal projection of the gate electrode onto the base substrate, and the gate electrode and the first electrode may be formed through a single patterning process.

In the embodiments of the present disclosure, when the orthogonal projection of the active layer onto the base substrate falls within the orthogonal projection of the gate electrode onto the base substrate, i.e., when the active layer is completely shielded by the gate electrode, it is able to prevent the active layer of the oxide TFT from being adversely affected by light, thereby to improve the stability of the oxide TFT. In other words, in the embodiments of the present disclosure, the gate electrode may be reused as the light-shielding layer. In addition, when the gate electrode and the first electrode of the PIN photodiode are formed through a single patterning process, it is able to reduce the quantity of masks for the manufacture of the OLED display substrate, thereby to reduce the manufacture cost.

In the embodiments of the present disclosure, the gate electrode and the first electrode may each be made of a metal material.

In a possible embodiment of the present disclosure, the insulative protection layer may be a gate insulation layer of the oxide TFT, i.e., the gate insulation layer of the oxide TFT may be reused as the insulative protection layer, so as to reduce a membrane thickness of the OLED display substrate.

In a possible embodiment of the present disclosure, the oxide TFT may further include a switching TFT connected to the PIN photodiode and configured to control the PIN photodiode to be electrically connected to, or electrically disconnected from, the external driving IC. Prior to forming the source electrode and the drain electrode of the oxide TFT, the method may further include forming a via-hole penetrating through a layer on the second electrode of the PIN photodiode. The layer may at least include the insulative protection layer. Subsequent to forming the via-hole penetrating through the layer on the second electrode of the PIN photodiode, the method may further include forming a conductive connection pattern. The conductive connection pattern may be at least partially located within the via-hole and configured to connect the second electrode and a source electrode of the switching TFT. The conductive connection pattern and the source electrode and the drain electrode of the oxide TFT may be formed through a single patterning process, so as to reduce the quantity of masks for the manufacture of the OLED display substrate, thereby to reduce the manufacture cost.

The method for manufacturing the OLED display substrate will be described hereinafter in conjunction with the embodiments.

The OLED display substrate may include an oxide TFT, an OLED and a PIN photodiode. The oxide TFT may be a top-gate TFT. As shown in FIGS. 4A to 4H, the method of manufacturing the OLED display substrate may include the following steps.

Figure 4A:
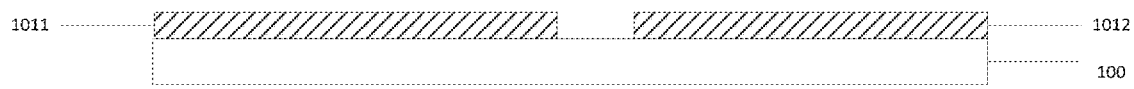
FIGS. 4A-4H are schematic views showing the method of manufacturing the OLED display substrate according to one embodiment of the present disclosure.

Step 41: as shown in FIG. 4A, forming a pattern of a light-shielding layer 1011 and a pattern of a first electrode 1012 of the PIN photodiode on a base substrate 100 through a single patterning process.

To be specific, a metal layer may be deposited onto the base substrate 100, and patterning processes such as exposing, developing and etching are performed on the metal layer, then the pattern of the light-shielding layer 1011 and the pattern of the first electrode 1012 of the PIN photodiode may be formed.

Figure 4B:
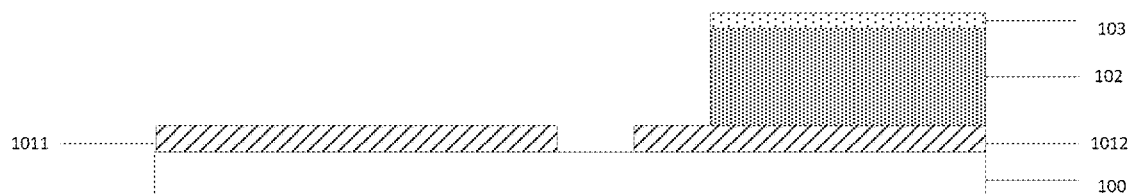

Step 42: as shown in FIG. 4B, forming a pattern of a photovoltaic conversion layer 102 of the PIN photodiode and a pattern of a second electrode 103 of the PIN photodiode through a single patterning process. The first electrode 1012, the photovoltaic conversion layer 102 and the second electrode 103 together form the PIN photodiode.

To be specific, a semiconductor thin film (for forming the photovoltaic conversion layer 102) may be deposited through Chemical Vapor Deposition (CVD), and then a transparent conductive oxide layer (for forming the second electrode 103) may be deposited through sputtering. Next, such patterning processes as exposing (one exposing process), developing and etching (two etching processes) may be performed using one mask, so as to form the pattern of the photovoltaic conversion layer 102 of the PIN photodiode and the pattern of the second electrode 103 of the PIN photodiode.

Figure 4C:
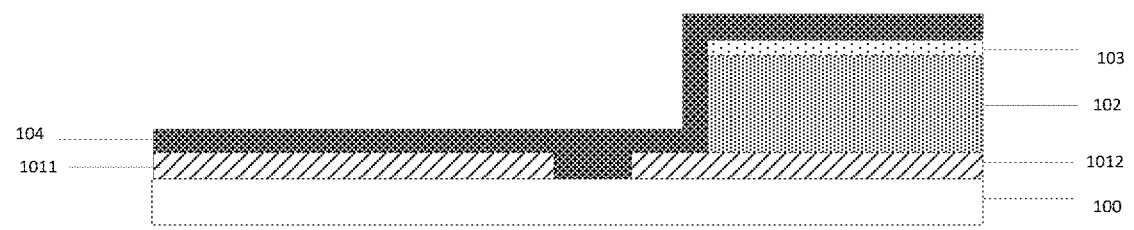

Step 43: as shown in FIG. 4C, depositing an insulative protection layer 104 covering the PIN photodiode.

Figure 4D:

Step 44: as shown in FIG. 4D, forming a pattern of an active layer 105 of the oxide TFT. An orthogonal projection of the active layer 105 onto the base substrate 100 completely falls within an orthogonal projection of the light-shielding layer 1011 onto the base substrate 100.

To be specific, a semiconductor thin film may be deposited, and then such patterning processes as exposing, developing and etching may be performed so as to form the pattern of the active layer 105.

Figure 4E:
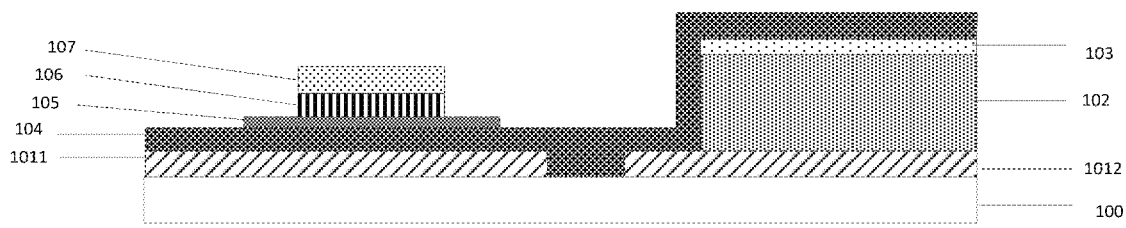

Step 45: as shown in FIG. 4E, forming a pattern of a gate electrode 106 and a pattern of a gate insulation layer 107 through a single patterning process.

To be specific, a metal thin film and a gate insulation film may be deposited, and then such patterning processes as exposing (one exposing process), developing and etching (two etching processes) may be performed using one mask, so as to form the pattern of the gate electrode 106 and the pattern of the gate insulation layer 107.

Figure 4F:
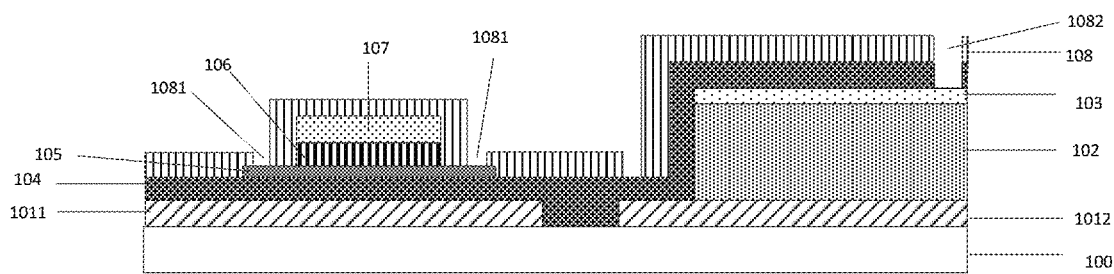

Step 46: as shown in FIG. 4F, forming an interlayer dielectric layer (ILD) 108, and forming a via-hole 1081 on the active layer 105 and penetrating through the interlayer dielectric layer 108 and a via-hole 1082 on the second electrode 103 and penetrating through the interlayer dielectric layer 108 and the insulative protection layer 104.

To be specific, the interlayer dielectric layer 108 may be deposited, and then such patterning processes as exposing (two exposing processes), developing and etching (two etching processes) may be performed, so as to form the via-hole 1081 and the via-hole 1082. During the formation of the via-hole 1081, merely the interlayer dielectric layer 108 may be etched, and during the formation of the via-hole 1082, both the interlayer dielectric layer 108 and the insulative protection layer 104 may be etched.

Figure 4G:
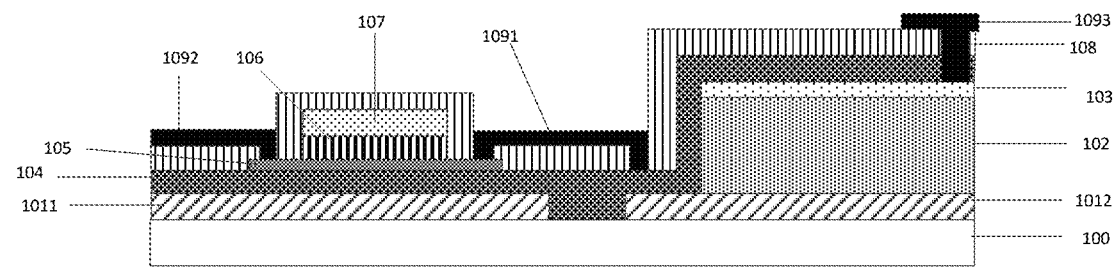

Step 47: as shown in FIG. 4G, forming a source electrode 1091, a drain electrode 1092 and a conductive connection pattern 1093. The source electrode 1091 and the drain electrode 1092 are connected to the active layer 105 via the via-hole 1081, and the conductive connection pattern 1093 is connected to the second electrode 103 via the via-hole 1082, so as to enable the PIN photodiode to be connected to the oxide TFT through which the PIN photodiode is controlled.

To be specific, a metal thin film may be deposited, and then such patterning processes as exposing, developing and etching may be performed so as to form the source electrode 1091, the drain electrode 1092 and the conductive connection pattern 1093.

Figure 4H:
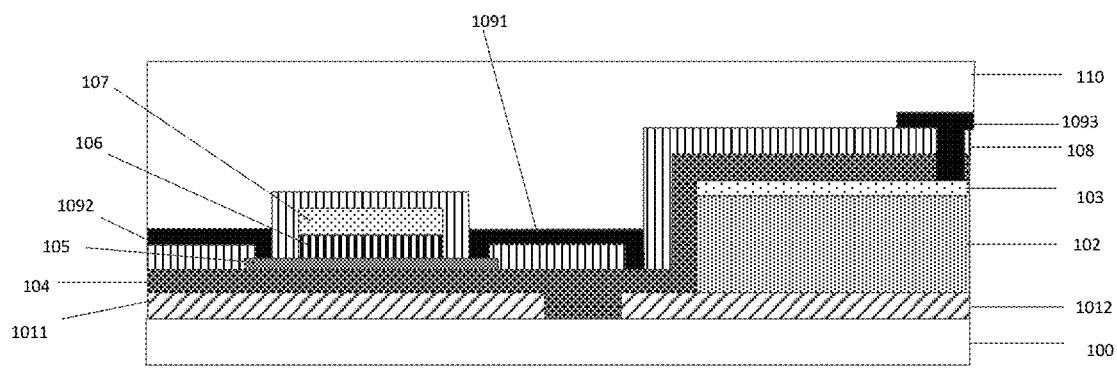

Step 48: as shown in FIG. 4H, forming a protection layer 110, e.g., a passivation (PVX) layer.

In this embodiment of the present disclosure, the oxide TFT and the PIN photodiode may be formed through seven masking processes, so it is able to simplify the manufacture process as well as save the manufacture cost. In addition, the formation of the oxide TFT may not affect, and may not be affected by, the formation of the PIN photodiode, so it is able to improve the quality of the OLED display substrate.

The OLED display substrate may include an oxide TFT, an OLED and a PIN photodiode. The oxide TFT may be a bottom-gate TFT. As shown in FIG. 5, the method of manufacturing the OLED display substrate may include the following steps.

Figure 5A:
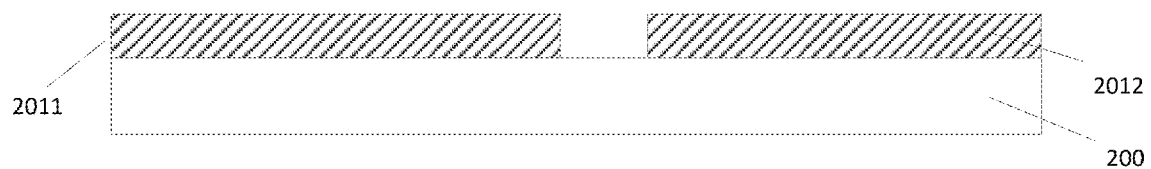
FIGS. 5A-5G are schematic views showing the method of manufacturing the OLED display substrate according to one embodiment of the present disclosure.

Step 51: as shown in FIG. 5A, forming a pattern of a gate electrode 2011 of the oxide TFT and a pattern of a first electrode 2012 of the PIN photodiode on a base substrate 200 through a single patterning process.

To be specific, a metal layer may be deposited onto the base substrate 200, and patterning processes such as exposing, developing and etching are performed on the metal layer, then the pattern of the gate electrode 2011 and the pattern of the first electrode 2012 of the PIN photodiode may be formed.

Figure 5B:
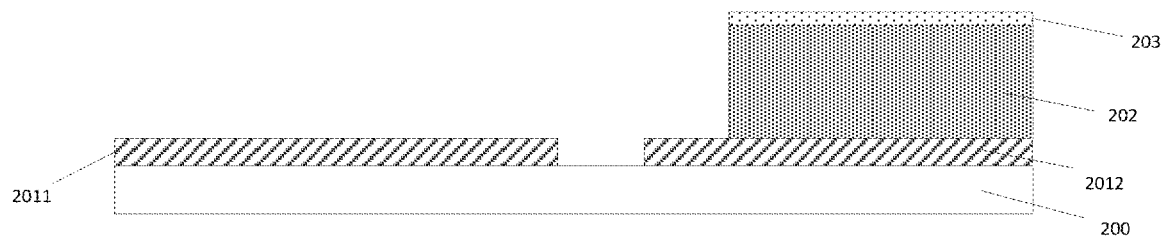

Step 52: as shown in FIG. 5B, forming a pattern of a photovoltaic conversion layer 202 of the PIN photodiode and a pattern of a second electrode 203 of the PIN photodiode through a single patterning process. The first electrode 2012, the photovoltaic conversion layer 202 and the second electrode 203 together form the PIN photodiode.

To be specific, a semiconductor thin film (for forming the photovoltaic conversion layer 202) may be deposited through CVD, and then a transparent conductive oxide layer (for forming the second electrode 203) may be deposited through sputtering. Next, such patterning processes as exposing (one exposing process), developing and etching (two etching processes) may be performed using one mask, so as to form the pattern of the photovoltaic conversion layer 202 of the PIN photodiode and the pattern of the second electrode 203 of the PIN photodiode.

Figure 5C:
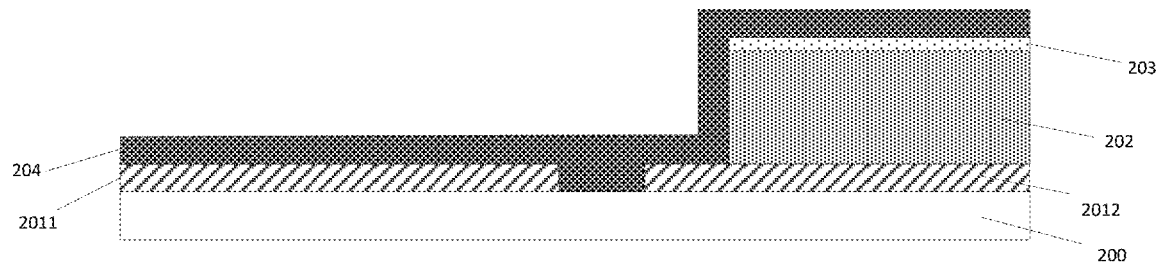

Step 53: as shown in FIG. 5C, depositing a gate insulation layer 204 covering the PIN photodiode.

Figure 5D:
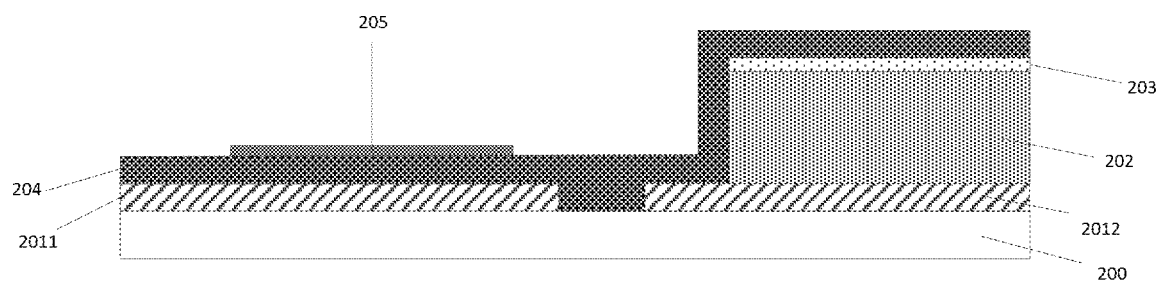

Step 54: as shown in FIG. 5D, forming a pattern of an active layer 205 of the oxide TFT. An orthogonal projection of the active layer 205 onto the base substrate 200 completely falls within an orthogonal projection of the gate electrode 2011 onto the base substrate 200.

To be specific, a semiconductor thin film may be deposited, and then such patterning processes as exposing, developing and etching may be performed so as to form the pattern of the active layer 205.

Figure 5E:
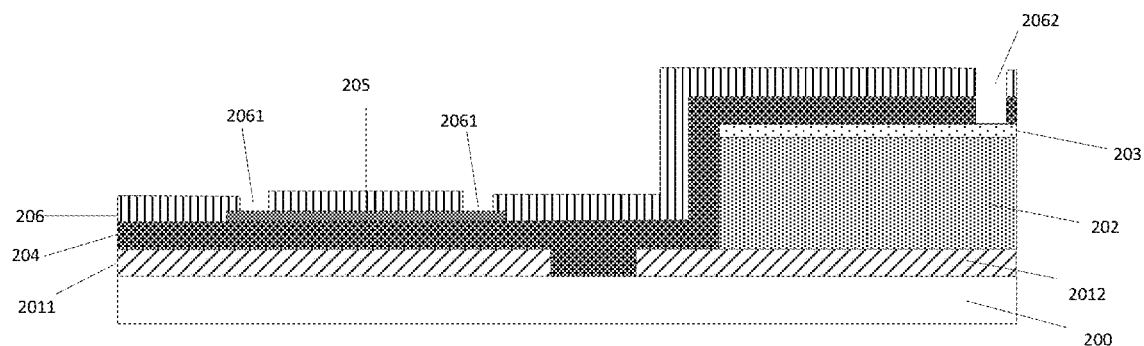

Step 55: as shown in FIG. 5E, forming an etch stop layer 206, and forming a via-hole 2061 on the active layer 205 and penetrating through the etch stop layer 206 and a via-hole 2062 on the second electrode 203 and penetrating through the etch stop layer 206 and the gate insulation layer 204.

To be specific, the etch stop layer 206 may be deposited, and then such patterning processes as exposing (two exposing processes), developing and etching (two etching processes) may be performed, so as to form the via-hole 2061 and the via-hole 2062. During the formation of the via-hole 2061, merely the etch stop layer 206 may be etched, and during the formation of the via-hole 2062, both the etch stop layer 206 and the gate insulation layer 204 may be etched.

Figure 5F:
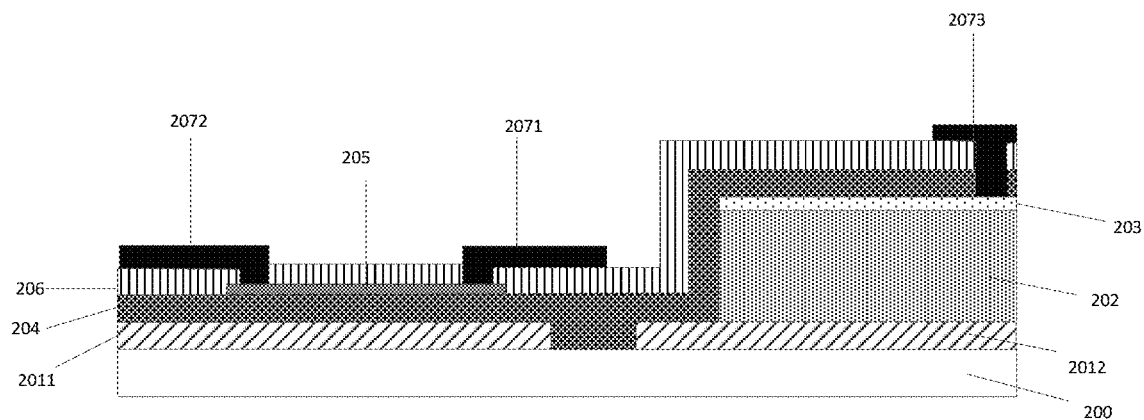

Step 56: as shown in FIG. 5F, forming a source electrode 2071, a drain electrode 2072 and a conductive connection pattern 2073. The source electrode 2071 and the drain electrode 2072 are connected to the active layer 205 via the via-hole 2061, and the conductive connection pattern 2073 is connected to the second electrode 203 via the via-hole 2062, so as to enable the PIN photodiode to be connected to the oxide TFT through which the PIN photodiode is controlled.

To be specific, a metal thin film may be deposited, and then such patterning processes as exposing, developing and etching may be performed so as to form the source electrode 2071, the drain electrode 2072 and the conductive connection pattern 2073.

Figure 5G:
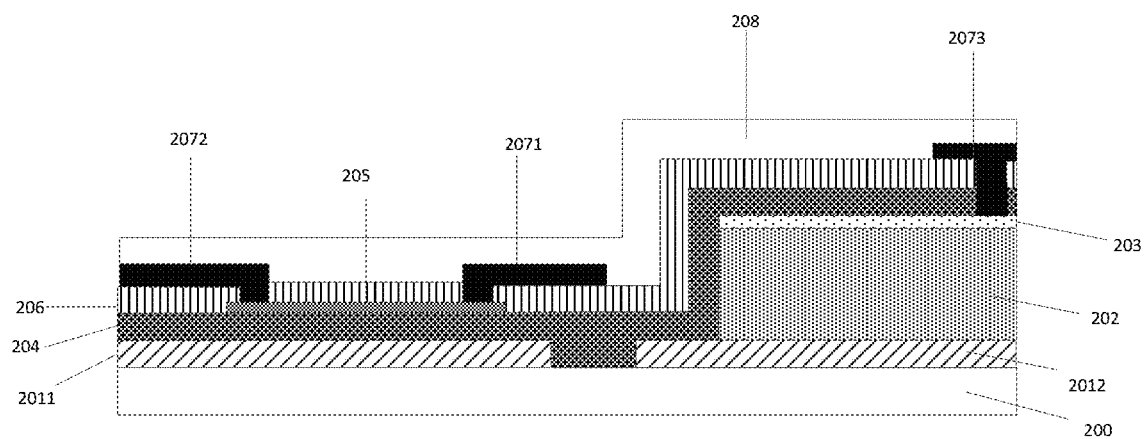

Step 57: as shown in FIG. 5G, forming a protection layer 208, e.g., a passivation (PVX) layer.

In this embodiment of the present disclosure, the oxide TFT and the PIN photodiode may be formed through five masking processes, so it is able to simplify the manufacture process as well as save the manufacture cost. In addition, the formation of the oxide TFT may not affect, and may not be affected by, the formation of the PIN photodiode, so it is able to improve the quality of the OLED display substrate.

The present disclosure further provides in some embodiments an OLED display substrate manufactured through the above-mentioned method. The OLED display substrate includes a base substrate, a PIN photodiode arranged on the base substrate, an insulative protection layer covering the PIN photodiode, and an oxide TFT including a gate electrode, an active layer, a source electrode and a drain electrode.

In a possible embodiment of the present disclosure, the insulative protection layer may cover the entire base substrate, i.e., the active layer, the source electrode and the drain electrode of the oxide TFT may be arranged on the insulative protection layer.

In another possible embodiment of the present disclosure, the insulative protection layer may merely cover the PIN photodiode.

In a possible embodiment of the present disclosure, the PIN photodiode may include a first electrode, a photovoltaic conversion layer arranged on the first electrode, and a second electrode arranged on the photovoltaic conversion layer.

In a possible embodiment of the present disclosure, the oxide TFT may be a top-gate TFT. The OLED display substrate may further include a light-shielding layer. An orthogonal projection of the active layer of the oxide TFT onto the base substrate may fall within an orthogonal projection of the light-shielding layer onto the base substrate, and the light-shielding layer may be arranged at a same layer, and made of a same material, as the first electrode.

In another possible embodiment of the present disclosure, the oxide TFT may be a bottom-gate TFT. An orthogonal projection of the active layer of the oxide TFT onto the base substrate may fall within an orthogonal projection of the gate electrode of the oxide TFT onto the base substrate, and the gate electrode of the oxide TFT may be arranged at a same layer, and made of a same material, as the first electrode.

In a possible embodiment of the present disclosure, a gate insulation layer of the oxide TFT may be reused as the insulative protection layer.

In a possible embodiment of the present disclosure, the oxide TFT may include a switching TFT connected to the PIN photodiode. The OLED display substrate may further include a conductive connection pattern connected to a source electrode of the switching TFT through a via-hole penetrating a layer on the second electrode. The conductive connection pattern may be arranged at a same layer, and made of a same material, as the source electrode and the drain electrode of the oxide TFT.

The present disclosure further provides in some embodiments an OLED display device including the above-mentioned OLED display substrate.

In addition, the OLED display device may further include a driving IC connected to the PIN photodiode of the OLED display substrate, and configured to adjust a driving current applied to an OLED in accordance with an electric signal from the PIN photodiode, so as to perform real-time optical compensation on the OLED.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method of manufacturing an Organic Light-Emitting Diode (OLED) display substrate, comprising:

forming a PIN photodiode on a base substrate, forming an insulative protection layer covering the PIN photodiode, and forming an oxide Thin Film Transistor (TFT), the oxide TFT comprising a switching TFT connected to the PIN photodiode, said forming the PIN photodiode on the base substrate comprising:

forming a first electrode of the PIN photodiode on the base substrate;

forming a photovoltaic conversion layer of the PIN photodiode on the first electrode; and forming a second electrode of the PIN photodiode on the photovoltaic conversion layer, wherein the PIN photodiode is formed prior to the formation of an active layer of the oxide TFT, and the insulative protection layer covering the PIN photodiode is formed prior to the formation of a source electrode and a drain electrode of the oxide TFT;

prior to forming the source electrode and the drain electrode of the oxide TFT, the method further comprises forming a via-hole penetrating through a layer on the second electrode of the PIN photodiode; and subsequent to forming the via-hole penetrating through the layer on the second electrode of the PIN photodiode, the method further comprises forming a conductive connection pattern, wherein the conductive connection pattern is at least partially located within the via-hole and configured to connect the second electrode and a source electrode of the switching TFT, and wherein the conductive connection pattern and the source electrode and the drain electrode of the oxide TFT are formed through a single patterning process.

2. The method according to claim 1, wherein the oxide TFT is a top-gate TFT;

prior to forming the active layer of the oxide TFT, the method further comprises forming a light-shielding layer; and an orthogonal projection of the active layer onto the base substrate falls within an orthogonal projection of the light-shielding layer onto the base substrate, and the light-shielding layer and the first electrode are formed through a single patterning process.

3. The method according to claim 1, wherein the oxide TFT is a bottom-gate TFT;

prior to forming the active layer of the oxide TFT, the method further comprises forming a gate electrode of the oxide TFT; and an orthogonal projection of the active layer onto the base substrate falls within an orthogonal projection of the gate electrode onto the base substrate, and the gate electrode and the first electrode are formed through a single patterning process.

4. The method according to claim 3, wherein the insulative protection layer is a gate insulation layer of the oxide TFT.

* * * * *